United States Patent
Tian

(10) Patent No.: US 9,299,808 B2
(45) Date of Patent: Mar. 29, 2016

(54) MANUFACTURING METHOD OF LOW TEMPERATURE POLYSILICON, LOW TEMPERATURE POLYSILICON FILM AND THIN FILM TRANSISTOR

(71) Applicant: BOE TECHNOLOGY GROUP CO., LTD., Beijing (CN)

(72) Inventor: Xueyan Tian, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 14/349,583

(22) PCT Filed: Oct. 22, 2013

(86) PCT No.: PCT/CN2013/085683
§ 371 (c)(1),
(2) Date: Apr. 3, 2014

(87) PCT Pub. No.: WO2014/169601
PCT Pub. Date: Oct. 23, 2014

(65) Prior Publication Data
US 2015/0194502 A1  Jul. 9, 2015

(30) Foreign Application Priority Data
Apr. 19, 2013 (CN) .......................... 2013 1 0139120

(51) Int. Cl.
| | | |
|---|---|---|
| *H01L 29/66* | (2006.01) | |
| *H01L 21/02* | (2006.01) | |
| *H01L 21/268* | (2006.01) | |
| *H01L 29/786* | (2006.01) | |
| *H01L 27/12* | (2006.01) | |
| *H01L 21/324* | (2006.01) | |
| *H01L 27/32* | (2006.01) | |
| *H01L 29/04* | (2006.01) | |

(Continued)

(52) U.S. Cl.
CPC ...... *H01L 29/6675* (2013.01); *H01L 21/02164* (2013.01); *H01L 21/02422* (2013.01);
(Continued)

(58) Field of Classification Search
CPC .................................................. H01L 29/66757
See application file for complete search history.

(56) References Cited

U.S. PATENT DOCUMENTS 6,815,377 B2  11/2004 Mitsuhashi et al.
(Continued)

FOREIGN PATENT DOCUMENTS

| CN | 1501457 A | 6/2004 |
|---|---|---|
| CN | 1638017 A | 7/2005 |

(Continued)

OTHER PUBLICATIONS

International Search Report, International Preliminary Report on Patentability and Written Opinion of the International Searching Authority of PCT/CN2013/085683 in Chinese mailed Feb. 20, 2014.
(Continued)

*Primary Examiner* — Mamadou Diallo
(74) *Attorney, Agent, or Firm* — Collard & Roe, P.C.

(57) ABSTRACT

A method of manufacturing low temperature polysilicon is provided, comprising: depositing a buffer layer (20) on a base substrate (10); depositing an amorphous silicon layer (30) on the buffer layer; performing a heat treatment after forming the amorphous silicon layer; and dividing the amorphous silicon layer into a plurality of areas for laser annealing according to a thickness distribution of the amorphous silicon layer to form a polycrystalline silicon layer. A low temperature polysilicon film manufactured by the low temperature polysilicon manufacturing method and a thin film transistor having the film are also provided. The method realizes large grain size for polysilicons in each area of the amorphous silicon layer and a uniform distribution of polysilicon grain size across the entire substrate.

15 Claims, 3 Drawing Sheets

(52) U.S. Cl.
CPC .... *H01L21/02532* (2013.01); *H01L 21/02592* (2013.01); *H01L 21/02667* (2013.01); *H01L 21/02686* (2013.01); *H01L 21/268* (2013.01); *H01L 21/324* (2013.01); *H01L 27/1285* (2013.01); *H01L 27/3244* (2013.01); *H01L 29/04* (2013.01); *H01L 29/78603* (2013.01); *H01L 29/78672* (2013.01)

(56) References Cited

U.S. PATENT DOCUMENTS

| | | | |
|---|---|---|---|
| 2003/0036251 A1 | 2/2003 | Mitsuhashi et al. | |
| 2005/0142701 A1 | 6/2005 | Yamaguchi et al. | |
| 2006/0093807 A1* | 5/2006 | Chang et al. | 428/313.3 |
| 2008/0020555 A1* | 1/2008 | Shimomura et al. | 438/487 |

FOREIGN PATENT DOCUMENTS

| | | |
|---|---|---|
| CN | 102945789 A | 2/2013 |
| CN | 103219230 A | 7/2013 |
| JP | 2005011840 A | 1/2005 |
| TW | 245112 B | 12/2005 |

OTHER PUBLICATIONS

Chinese Office Action of Chinese Application No. 201213109120.5, mailed Mar. 20, 2015 with English translation.

International Search Report of PCT/CN2013/085683, in English, mailed Feb. 20, 2014.

English translation of the International Preliminary Report on Patentability and Written Opinion of the International Searching Authority of PCT/CN2013/085683, issued Oct. 20, 2015.

* cited by examiner

MANUFACTURING METHOD OF LOW TEMPERATURE POLYSILICON, LOW TEMPERATURE POLYSILICON FILM AND THIN FILM TRANSISTOR

CROSS REFERENCE TO RELATED APPLICATIONS

This application is the National Stage of PCT/CN2013/085683 filed on Oct. 22, 2013, which claims priority under 35 U.S.C. §119 of Chinese Application No. 201310139120.5 filed on Apr. 19, 2013, the disclosure of which is incorporated by reference. The international application under PCT article 21(2) was not published in English.

TECHNICAL FIELD

Embodiments of the present invention relate to a method of manufacturing low temperature polysilicons, a low temperature polysilicon film based on the method and a thin film transistor having the low temperature polysilicon film.

BACKGROUND

Active matrix organic light emitting diode (AMOLED) panels become a preference for future display technology due to their advantages such as high picture quality, short response time of moving image, low power consumption, wide viewing angle and super light and thin profile. In the backboard technology for AMOLED, technologies for manufacturing polycrystalline silicon layers include various manufacturing methods, such as excimer laser annealing (ELA), solid phase crystallization (SPC) and metal induced crystallization (MIC). Currently, a method capable of mass production of active layers in transistors for backboards is the excimer laser annealing (ELA) method.

The excimer laser annealing (ELA) process is a relatively complex annealing process. In a polysilicon film, controlling grain size and grain uniformity has always been a research hotspot in this technical field, because the amount and distribution of polysilicon crystal grains covered by a channel region of a low temperature polysilicon film transistor, namely, the uniformity issue, would directly influence the electricity performance of the low temperature polysilicon film transistor, such as magnitude of mobility, uniformity of mobility and threshold voltage.

Thickness distribution of an amorphous silicon film is generally non-uniform. An amorphous silicon film is generally thinner in the middle than at edge, or thicker in the middle than at edge. Even for an amorphous silicon film with good uniformity, the film thickness varies.

Therefore, how to control amorphous silicons to become ideal polysilicons, namely, making a polysilicon film have large size and uniformly distributed grains, has been a technical challenge difficult to resolve.

SUMMARY

Generally, embodiments of the present invention provide a method of manufacturing low temperature polysilicons, comprising: forming a buffer layer on a base substrate; forming an amorphous silicon layer on said buffer layer; performing heat treatment after forming said amorphous silicon layer; and dividing said amorphous silicon layer into a plurality of areas for laser annealing according to a thickness distribution of said amorphous silicon layer to form a polycrystalline silicon layer.

Furthermore, for example, said amorphous silicon layer is divided into at least one thicker film area and at least one thinner film area for laser annealing according to its thickness distribution; and when performing the laser annealing, a laser energy density used for said at least one thicker film area is greater than that of used for said at least one thinner film area.

Furthermore, for example, said amorphous silicon layer is divided into three areas: a thinner center area being a second area, two thicker side areas being a first area and a third area, respectively; laser annealing conditions for the first area are: laser pulse frequency of about 200-400 Hz, overlapping ratio of about 92%-98%, and laser energy density of about 240-250 mJ/cm$^2$; laser annealing conditions for the second area are: laser pulse frequency of about 200-400 Hz, overlapping ratio of about 92%-98%, and laser energy density of about 230-240 mJ/cm$^2$; and laser annealing conditions for the third area are: laser pulse frequency of about 200-400 Hz, overlapping ratio of about 92%-98%, and laser energy density of about 240-250 mJ/cm$^2$.

Furthermore, for example, said amorphous silicon layer is divided into three areas: a thicker center area being a second area, two thinner side areas being a first area and a third area, respectively; laser annealing conditions for the first area are: laser pulse frequency of about 200-400 Hz, overlapping ratio of about 92%-98%, and laser energy density of about 220-250 mJ/cm$^2$; laser annealing conditions for the second area are: laser pulse frequency of about 200-400 Hz, overlapping ratio of about 92%-98%, and laser energy density of about 260-280 mJ/cm$^2$; and laser annealing conditions for the third area are: laser pulse frequency of about 200-400 Hz, overlapping ratio of about 92%-98%, and laser energy density of about 250-270 mJ/cm$^2$.

Furthermore, for example, the buffer layer comprises a silicon oxide film layer with a thickness of about 50-150 nm and a silicon dioxide film layer with a thickness of about 100-350 nm deposited sequentially on said base substrate.

Furthermore, for example, an amorphous silicon layer with a thickness of about 30-50 nm is deposited on the buffer layer.

Furthermore, for example, the amorphous silicon layer is subjected to a heat treatment for about 0.5-3 hours under a temperature of about 400-500□ after depositing the amorphous silicon layer on said buffer layer.

Furthermore, for example, the amorphous silicon layer is subjected to the laser annealing process with an excimer laser.

Furthermore, for example, the excimer laser is a xenon chloride, or a krypton fluoride, or argon fluoride excimer laser.

Embodiments of the present invention further provide a low temperature polysilicon film manufactured by the method, comprising a buffer layer and a polycrystalline silicon layer sequentially formed on a same side of the base substrate.

Embodiments of the present invention further provide a thin film transistor comprising the low temperature polysilicon film.

BRIEF DESCRIPTION OF THE DRAWINGS

Embodiments of the present invention will be described in more detail below with reference to the accompanying drawings to enable those skilled in the art to understand the present invention more clearly, wherein.

Figure 1:
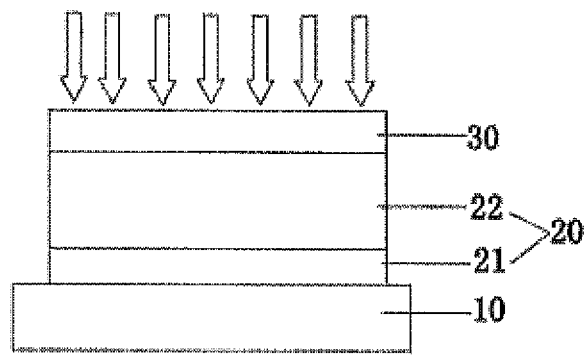
FIG. 1 is a principle diagram of manufacturing process of low temperature polysilicons according to the present invention.

Reference numerals: 10, base substrate; 11, liquid crystal panel; 20, buffer layer; 21, SiNx film layer; 22, SiO$_2$ film layer; 30, amorphous silicon layer.

DETAILED DESCRIPTION OF THE PREFERRED EMBODIMENTS

In order to make objects, technical details and advantages of the embodiments of the invention apparent, technical solutions according to the embodiments of the present invention will be described clearly and completely as below in conjunction with the accompanying drawings of embodiments of the present invention. It is apparent that the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

Specific implementations of the present invention will be further described below with respect to the accompanying drawings and embodiments.

As shown in FIG. 1, an embodiment of the present invention provides a manufacturing method of low temperature (typically, a temperature below 600□) polysilicons (LTPS) including: forming (for example, depositing) a buffer layer 20 on a base substrate; forming (for example, depositing) an amorphous silicon layer 30 on the buffer layer 20; performing heat treatment after forming the amorphous silicon layer; and dividing the amorphous silicon layer 30 into a plurality of regions for laser annealing according to its thickness distribution. Annealing different regions with a laser of different energies to convert the amorphous silicon layer into a polycrystalline silicon layer.

If the cleaness of the base substrate 10 does not satisfy requirements, pre-cleaning the base substrate 10 may be performed. The pre-cleaning may be performed in various ways, such as cleaning the substrate with cleaning fluid or blowing with air knife.

For example, the buffer layer 20 may function as preventing metal ions in the base substrate 10 from diffusing into the manufactured LTPS active region, reducing defect centers and generation of leakage current. A suitable buffer layer can improve the quality of the polysilicons' back interface, and prevent leakage current from generating at the polysilicons' back interface. And a suitable buffer layer thickness can reduce the heat conduction, slow down the cooling rate of the laser heated silicon and help to form large crystallized grains.

Heat treatment can dehydrogenate the amorphous silicon layer 30 to avoid hydrogen explosion when laser annealing the amorphous silicon layer 30.

For example, the buffer layer 20 may be deposited on the base substrate 10 by the plasma enhanced chemical vapor deposition (PECVD) method.

The buffer layer 20 includes a double buffer layer including a silicon nitride (SiN$_x$) film layer 21 with a thickness of about 50-150 nm and a silicon dioxide (SiO$_2$) film layer 22 with a thickness of about 100-350 nm sequentially formed on the base substrate 10. The double buffer layer is configured such that an upper layer of a surface of the buffer layer contacting the amorphous silicon layer is selected to be silicon oxide, and a bottom layer of a surface contacting the base substrate is silicon nitride, because silicon oxide contributes to form polysilicons with better crystalline phase better than silicon nitride while silicon nitride has a better effect of blocking contaminants from the base substrate. It is to be noted that the buffer layer 20 may also be a single-layer SiO$_2$ film layer. The effect of using a buffer layer with double layers is better than that of using a SiO$_2$ buffer layer with a single layer.

An amorphous silicon layer 30 is formed with about 30-50 nm thickness by deposition process on the buffer layer 20. The amorphous silicon layer is subjected to heat treatment for about 0.5-3 hours under a temperature of about 400-500□ after the step of depositing the amorphous silicon layer on the buffer layer is performed.

Finally, the amorphous silicon layer is subjected to laser annealing with an excimer laser, such as xenon chloride (XeCl), krypton fluoride, argon fluorinate excimer lasers.

The amorphous silicon layer 30 is divided into at least one thicker film area and at least one thinner film area for laser annealing according to the thickness distribution of the amorphous silicon layer 30. The thicker film area refers to an area of the amorphous silicon layer with relatively large thickness, while the thinner film area refers to an area of the amorphous silicon layer with relatively small thickness. The amorphous silicon layer is typically divided according to the thickness distribution of the entire layer.

When laser annealing is performed, the laser energy density applied at the thicker film area is greater than that applied at the thinner film area.

The manufacturing method of low temperature polysilicons according to the embodiments of the present invention considers inconsistency of laser energy absorption by amorphous silicon with different thickness, so that the amorphous silicon layer is divided into a plurality of areas for different laser annealing, which allows selecting suitable laser annealing process conditions for individual areas and obtaining a polysilicon film with large grain size and uniform distribution across the substrate.

Figure 2:
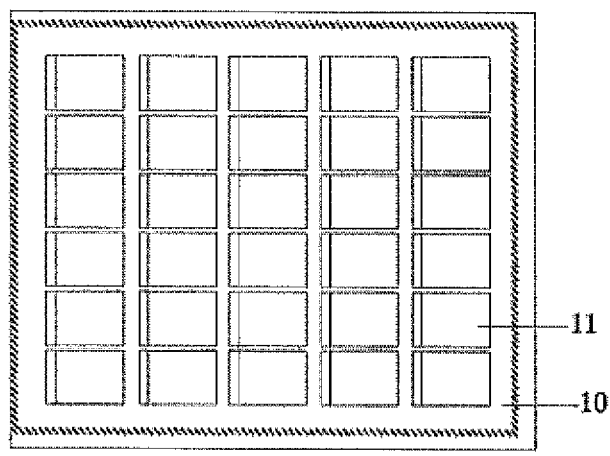
FIG. 2 is a structural schematic diagram of a base substrate in the present invention.

As shown in FIG. 2, for the base substrate 10 used in an embodiment of the present invention, organic light emitting diode panels 11 are arranged on the entire base substrate 10. Considering non-uniformity of the thickness distribution of the amorphous silicon film, and according to the general rule of the thickness distribution of base substrates, two illustrative embodiments are set forth below for explanation.

Embodiment I

Figure 3:
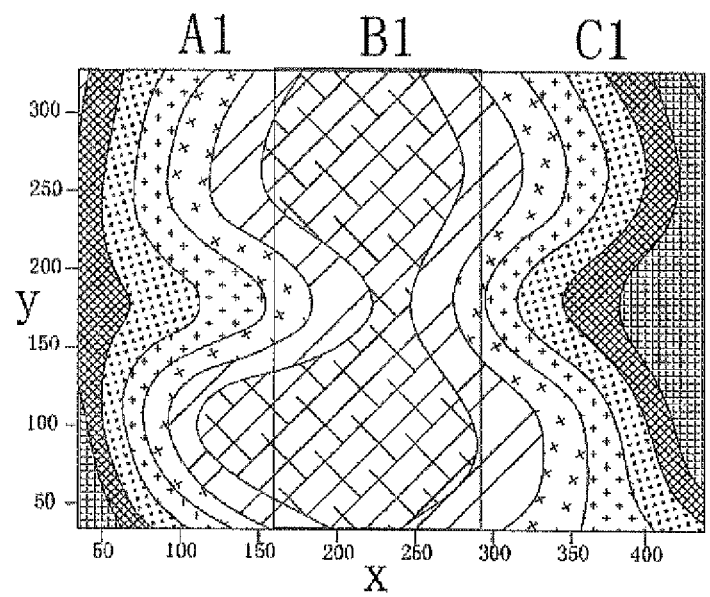
FIG. 3 is a diagram showing distribution of amorphous silicon thickness according to embodiment I of the present invention.

The present embodiment is implemented on the basis of the above-mentioned technical solution. When the amorphous silicon layer on the base substrate has a thickness distribution of "thinner center and thicker sides", as shown in FIG. 3, the amorphous silicon layer may be divided into three areas, wherein the thinner center area (for example, with a thickness smaller than 400 Å) is the second area B1 and two thicker side areas (for example, with a thickness greater than or equal to 400 Å) are the first area A1 and the third area C1 respectively. The laser annealing process for them includes:

Selecting laser annealing conditions for the first area A1 with: laser pulse frequency of about 200-400 Hz, preferably about 300 Hz, overlapping ratio of laser of about 92%-98%, and laser energy density of about 240-250 mJ/cm$^2$;

Selecting laser annealing conditions for the second area B1 with: laser pulse frequency of about 200-400 Hz, preferably about 300 Hz, overlapping ratio of laser of about 92%-98%, and laser energy density of about 230-240 mJ/cm$^2$; and Selecting laser annealing conditions for the third area C1 with: laser pulse frequency of about 200-400 Hz, preferably about 300 Hz, overlapping ratio of laser of about 92%-98%, and laser energy density of about 240-250 mJ/cm$^2$.

The statement of "thick/thicker" and "thin/thinner" are relative terms in sense. Therefore, the value for dividing thicker and thinner areas is not limited to 400 Å and could be other values.

Figure 4:
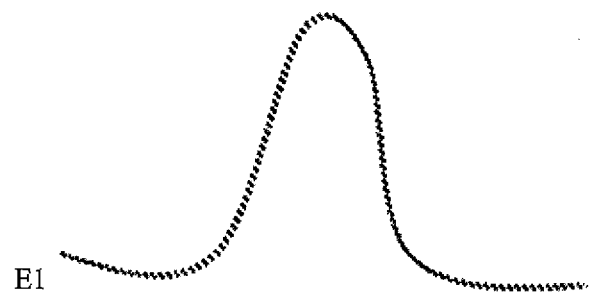
FIG. 4 is a diagram showing comparison of grains distribution between polysilicons manufactured by the method of embodiment I and a conventional method.

FIG. 4 is a schematic comparison diagram of grain size distribution F1 of the polysilicons made by the low temperature polysilicon manufacturing method of the present embodiment and grain size distribution E1 of the polysilicons made by a conventional method in which manufacturing is not implemented with a plurality of divided areas. The polysilicon grains made by the method of the present embodiment are substantially large grains with uniform size, while grains made by the common method have varying sizes, that is, the grains in the center area are large and the grains in two side areas are small.

Embodiment II

Figure 5:
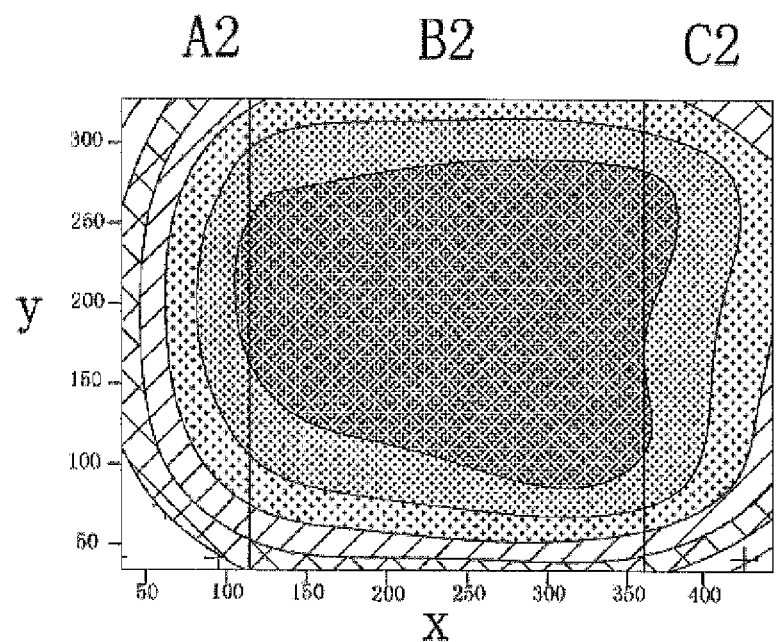
FIG. 5 is a diagram showing distribution of amorphous silicon thickness according to embodiment II of the present invention.

This embodiment differs from embodiment I in that the distribution of three areas of the amorphous silicon layer on the base substrate is different, that is, this embodiment has a distribution of "thicker center and thinner sides". As shown in FIG. 5, the thinner center area (for example, with a thickness smaller than 400 Å) is the second area B2, and the two thicker side areas (for example, with a thickness greater than or equal to 400 Å) are respectively the first area A2 and the third area C2. The laser annealing method includes:

Selecting the laser annealing conditions for the first area A2 with: laser pulse frequency of about 200-400 Hz, preferably about 300 Hz, overlapping ratio of laser of about 92%-98%, and laser energy density of about 220-250 mJ/cm$^2$;

Selecting the laser annealing conditions for the second area B2 with: laser pulse frequency of about 200-400 Hz, preferably about 300 Hz, overlapping ratio of laser of about 92%-98%, and laser energy density of about 260-280 mJ/cm$^2$;

Selecting laser annealing conditions for the third area C2 with: laser pulse frequency of about 200-400 Hz, preferably about 300 Hz, overlapping ratio of laser of about 92%-98%, and laser energy density of about 250-270 mJ/cm$^2$.

Figure 6:
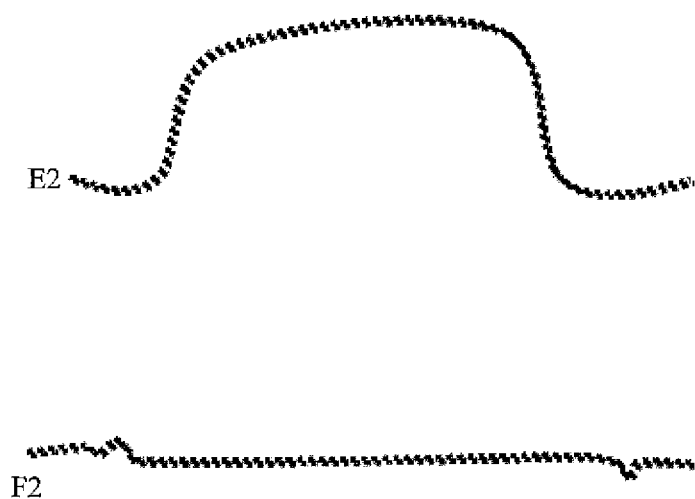
FIG. 6 is a diagram showing comparison of grains distribution between polysilicons manufactured by the method of embodiment II and a conventional method.

FIG. 6 is a schematic comparison diagram of grain size distribution F2 of the polysilicons manufactured by the low temperature polysilicon manufacturing method of the present embodiment and grain size distribution E2 of the polysilicons manufactured by a conventional method in which manufacturing is not implemented with a plurality of divided areas. The polysilicon grains manufactured by the method of the present embodiment are substantially large grains with uniform size, while grains manufactured by the common method have varying sizes, that is, grains in the center area are large and grains in the two side areas are small.

An embodiment of the present invention further provides a low temperature polysilicon film manufactured by the above described low temperature polysilicon manufacturing method including a buffer layer 20 and an amorphous silicon layer 30 formed sequentially on the same side of the base substrate 10.

An embodiment of the present invention further provides a thin film transistor including the above described low temperature polysilicon film. For example, the thin film transistor includes a gate, a gate insulating layer, an active layer using the above described low temperature polysilicon film, a source and a drain. The thin film transistor may be of various types, such as top gate type and bottom gate type.

The manufacturing method of the low temperature polysilicons according to embodiments of the present invention divides the amorphous silicon layer into a plurality of areas for laser annealing, obtaining large grain size for the polysilicons in each area and uniform distribution of the polysilicon grain size across the entire substrate. The low temperature polysilicon film and the thin film transistor based on the method have polysilicons with uniform large grains.

What have been described are only illustrative implementations of the present invention. It is understood that various modifications and variations may be made to the present invention without departing from the spirit and scope of the present invention by one skilled in the art, and it is intended that the present invention encompass these modifications and variations and any equivalents that fall within the scope of claims of the present invention.

What is claimed is:

1. A method of manufacturing low temperature polysilicons, comprising:
   forming a buffer layer on a base substrate;
   forming an amorphous silicon layer on said buffer layer;
   performing heat treatment after forming said amorphous silicon layer; and
   dividing said amorphous silicon layer into a plurality of areas for laser annealing according to a thickness distribution of said amorphous silicon layer to form a polycrystalline silicon layer;
   wherein said amorphous silicon layer is divided into three areas: a thinner center area being a second area, two thicker side areas being a first area and a third area, respectively;
   laser annealing conditions for the first area are: laser pulse frequency of about 200-400 Hz, overlapping ratio of about 92%-98%, and laser energy density of about 240-250mJ/cm$^2$;
   laser annealing conditions for the second area are: laser pulse frequency of about 200-400 Hz, overlapping ratio of about 92%-98%, and laser energy density of about 230-240mJ/cm$^2$; and
   laser annealing conditions for the third area are: laser pulse frequency of about 200-400 Hz, overlapping ratio of about 92%-98%, and laser energy density of about 240-250 mJ/cm$^2$.

2. The method of manufacturing low temperature polysilicons according to claim 1, wherein said buffer layer comprises a silicon nitride film layer with a thickness of about 50-150 nm and a silicon dioxide film layer with a thickness of about 100-350 nm deposited sequentially on said base substrate.

3. The method of manufacturing low temperature polysilicons according to claim 1, wherein an amorphous silicon layer with a thickness of about 30-50 nm is deposited on said buffer layer.

4. The method of manufacturing low temperature polysilicons according to claim 1, wherein said amorphous silicon layer is subjected to a laser annealing processing with an excimer laser.

5. The method of manufacturing low temperature polysilicons according to claim 4, wherein said excimer laser is a xenon chloride, or a krypton fluoride, or an argon fluoride excimer laser.

6. A low temperature polysilicon film manufactured by the method according to claim 1, comprising a buffer layer and a polycrystalline silicon layer sequentially formed on a same side of said base substrate.

7. A thin film transistor comprising the low temperature polysilicon film according to claim 6.

8. A method of manufacturing low temperature polysilicons, comprising:
   forming a buffer layer on a base substrate;
   forming an amorphous silicon layer on said buffer layer;
   performing heat treatment after forming said amorphous silicon layer; and
   dividing said amorphous silicon layer into a plurality of areas for laser annealing according to a thickness distribution of said amorphous silicon layer to form a polycrystalline silicon layer;
   wherein said amorphous silicon layer is divided into three areas: a thicker center area being a second area, two thinner side areas being a first area and a third area, respectively;
   laser annealing conditions for the first area are: laser pulse frequency of about 200-400 Hz, overlapping ratio of about 92%-98%, and laser energy density of about 220-250mJ/cm$^2$;
   laser annealing conditions for the second area are: laser pulse frequency of about 200-400 Hz, overlapping ratio of about 92%-98%, and laser energy density of about 260-280mJ/cm$^2$; and
   laser annealing conditions for the third area are: laser pulse frequency of about 200-400Hz, overlapping ratio of about 92%-98%, and laser energy density of about 250-270mJ/cm$^2$.

9. The method of manufacturing low temperature polysilicons according to claim 8, wherein said buffer layer comprises a silicon nitride film layer with a thickness of about 50-150 nm and a silicon dioxide film layer with a thickness of about 100-350nm deposited sequentially on said base substrate.

10. The method of manufacturing low temperature polysilicons according to claim 8, wherein an amorphous silicon layer with a thickness of about 30-50 nm is deposited on said buffer layer.

11. The method of manufacturing low temperature polysilicons according to claim 8, wherein said amorphous silicon layer is subjected to a laser annealing processing with an excimer laser.

12. The method of manufacturing low temperature polysilicons according to claim 11, wherein said excimer laser is a xenon chloride, or a krypton fluoride, or an argon fluoride excimer laser.

13. A method of manufacturing low temperature polysilicons, comprising:
   forming a buffer layer on a base substrate;
   forming an amorphous silicon layer on said buffer layer;
   performing heat treatment after forming said amorphous silicon layer; and
   dividing said amorphous silicon layer into a plurality of areas for laser annealing according to a thickness distribution of said amorphous silicon layer to form a polycrystalline silicon layer;
   wherein the plurality of areas include at least one thicker film area and at least one thinner film area for laser annealing according to its thickness distribution; and when performing the laser annealing, a laser energy density used for said at least one thicker film area is greater than that of used for said at least one thinner film area, and said amorphous silicon layer is subjected to a heat treatment for about 0.5-3 hours under a temperature of about 400-500° C. after depositing the amorphous silicon layer on said buffer layer.

14. The method of manufacturing low temperature polysilicons according to claim 13, wherein said amorphous silicon layer is subjected to a laser annealing processing with an excimer laser.

15. The method of manufacturing low temperature polysilicons according to claim 14, wherein said excimer laser is a xenon chloride, or a krypton fluoride, or an argon fluoride excimer laser.

* * * * *